(12) United States Patent
Dunn et al.

(10) Patent No.: US 9,034,562 B2
(45) Date of Patent: May 19, 2015

(54) PATTERN IMPROVEMENT IN MULTIPROCESS PATTERNING

(71) Applicant: International Business Machines Corporation, Armonk, NY (US)

(72) Inventors: Derren Neylon Dunn, Sandy Hook, CT (US); Ioana Graur, Poughkeepsie, NY (US); Scott Marshall Mansfield, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/755,450

(22) Filed: Jan. 31, 2013

(65) Prior Publication Data
US 2014/0162380 A1 Jun. 12, 2014

Related U.S. Application Data

(62) Division of application No. 12/581,422, filed on Oct. 19, 2009.

(51) Int. Cl.
| | |
|---|---|
| *G03F 7/20* | (2006.01) |
| *H01L 21/66* | (2006.01) |
| *H01L 21/033* | (2006.01) |
| *H01L 21/311* | (2006.01) |
| *H01L 21/768* | (2006.01) |

(52) U.S. Cl.
CPC ............ *H01L 22/12* (2013.01); *G03F 7/70441* (2013.01); *G03F 7/705* (2013.01); *H01L 21/0337* (2013.01); *H01L 21/0338* (2013.01); *H01L 21/31144* (2013.01); *H01L 21/76816* (2013.01)

(58) Field of Classification Search
CPC combination set(s) only.
See application file for complete search history.

(56) References Cited

U.S. PATENT DOCUMENTS

| | | | |
|---|---|---|---|
| 6,303,270 B1 | 10/2001 | Flaim et al. | |
| 6,553,559 B2 | 4/2003 | Liebmann et al. | |
| 7,159,205 B1 * | 1/2007 | Amblard et al. | ................ 716/54 |
| 8,099,686 B2 | 1/2012 | Schultz | |
| 2006/0248495 A1 * | 11/2006 | Sezginer | ......................... 716/19 |
| 2009/0117737 A1 * | 5/2009 | Butt et al. | ..................... 438/671 |

OTHER PUBLICATIONS

Neef et al., "Effects of Bake Temperature and Survace Modifications on Hardmask Materials for Trilayer Applications", Advances in Resist Materials and Processing Technology XXV, Proc. of SPIE vol. 6923, 602331, 2008, pp. 1-9.
Guerrere et al., "Photosensitive Titania Polymers", Journal of Photopolymer Science and Technology, vol. 15, No. 3, 2002, pp. 447-451.

* cited by examiner

*Primary Examiner* — Daborah Chacko Davis
(74) *Attorney, Agent, or Firm* — Whitham Curtis Christofferson & Cook, PC; Yuanmin Cai

(57) ABSTRACT

Improved fidelity to an integrated circuit pattern design in a semiconductor structure ultimately produced is achieved by modeling material removal and deposition processes in regard to materials, reactant, feature size, feature density, process parameters and the like as well as the effects of such parameters on etch and material deposition bias due to microloading and RIE lag (including inverse RIE lag) and using the models to work backward through the intended manufacturing method steps, including hard mask pattern decomposition, to morphologically develop feature patterns for use in most or all process steps which will result in the desired feature sizes and shapes at the completion of the overall process. Modeling of processes may be simplified through use of process assist features to locally adjust rates of material deposition and removal.

3 Claims, 12 Drawing Sheets

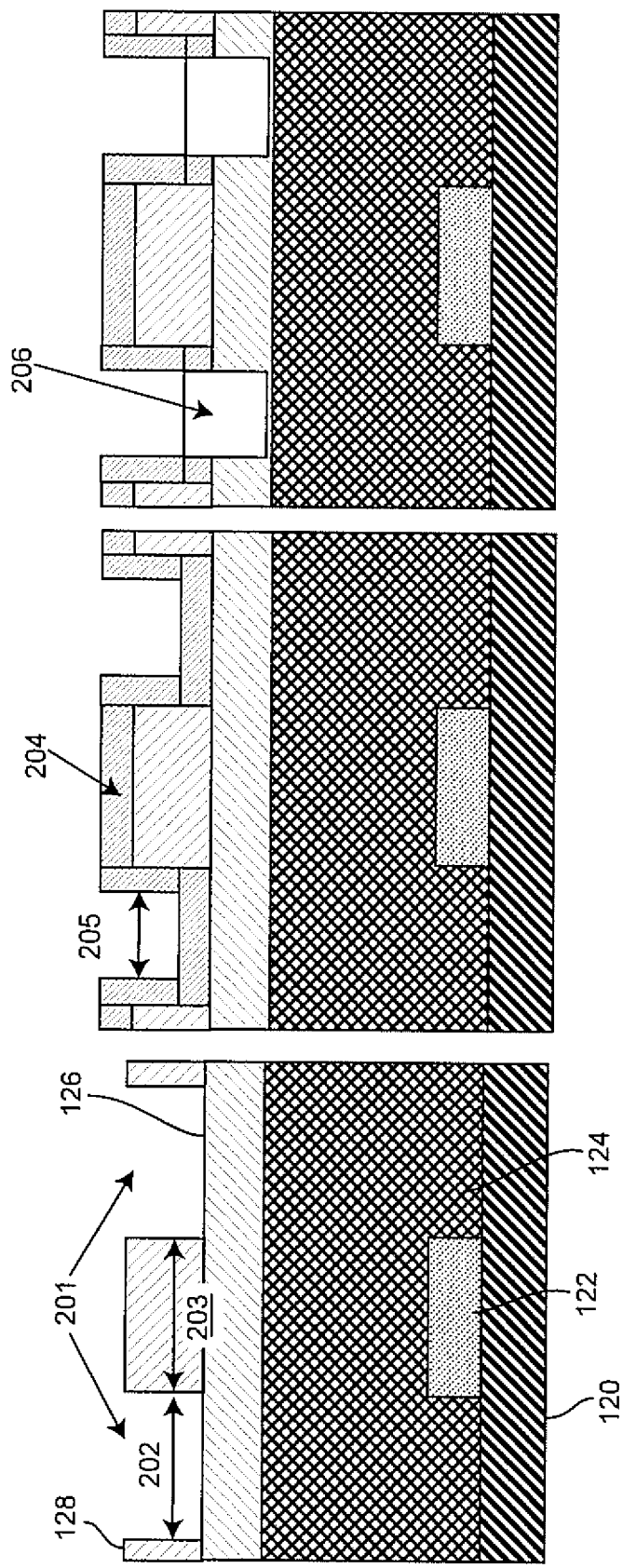

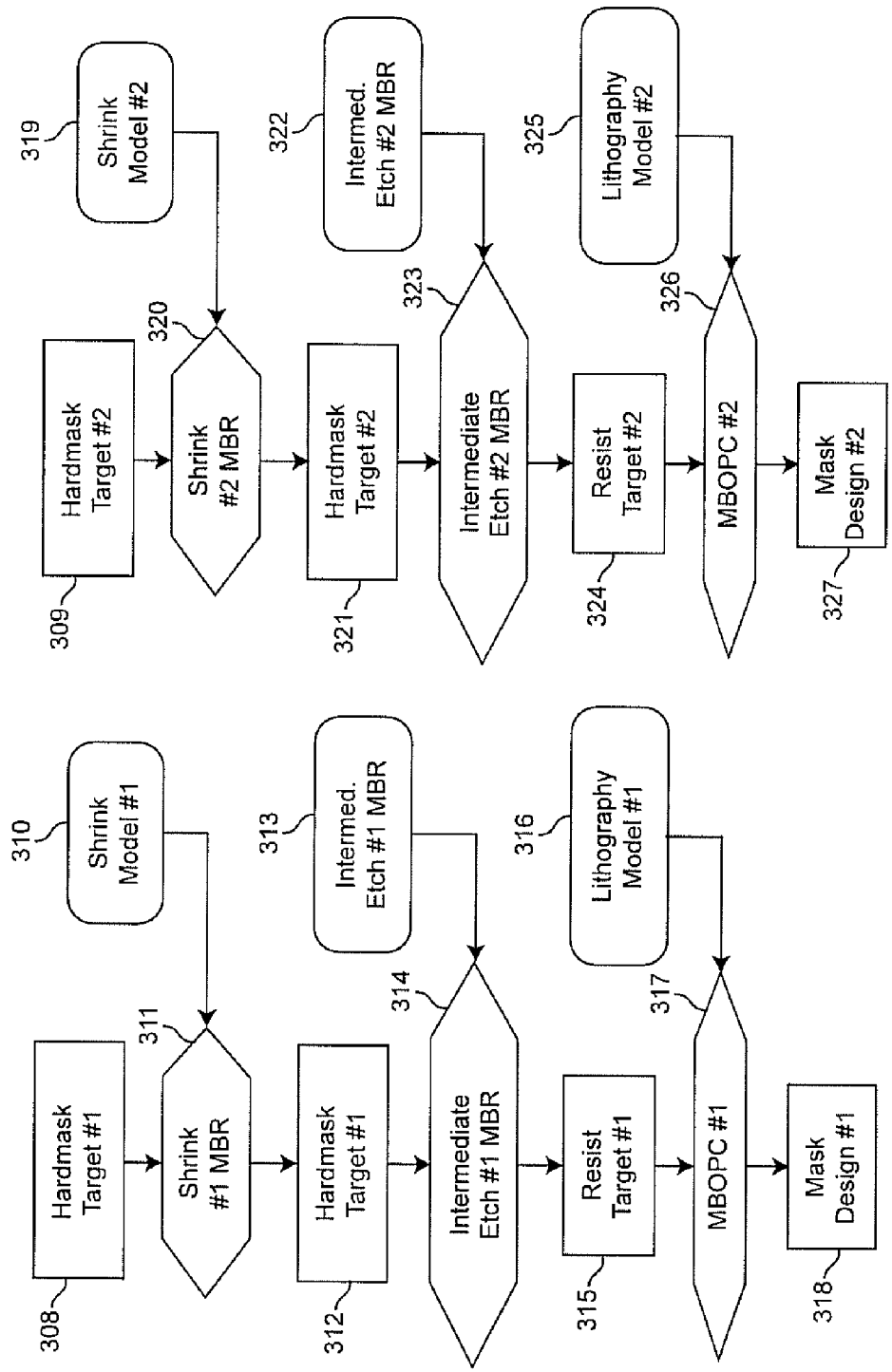

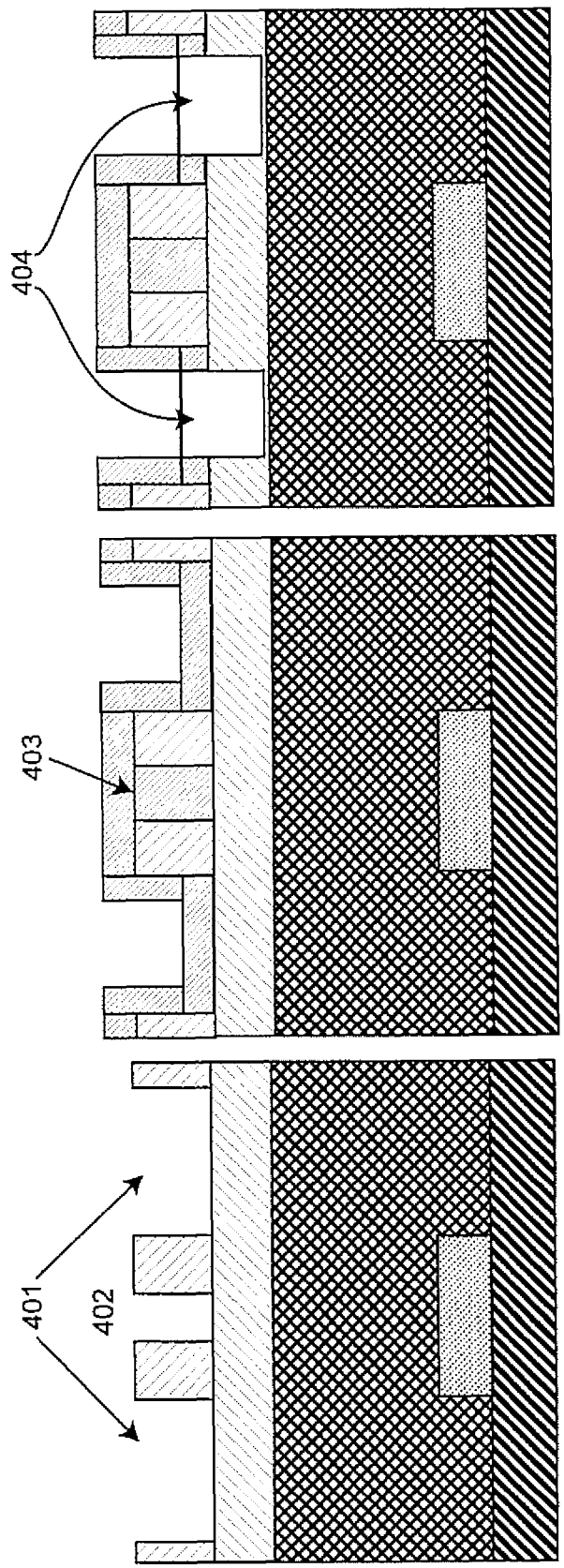

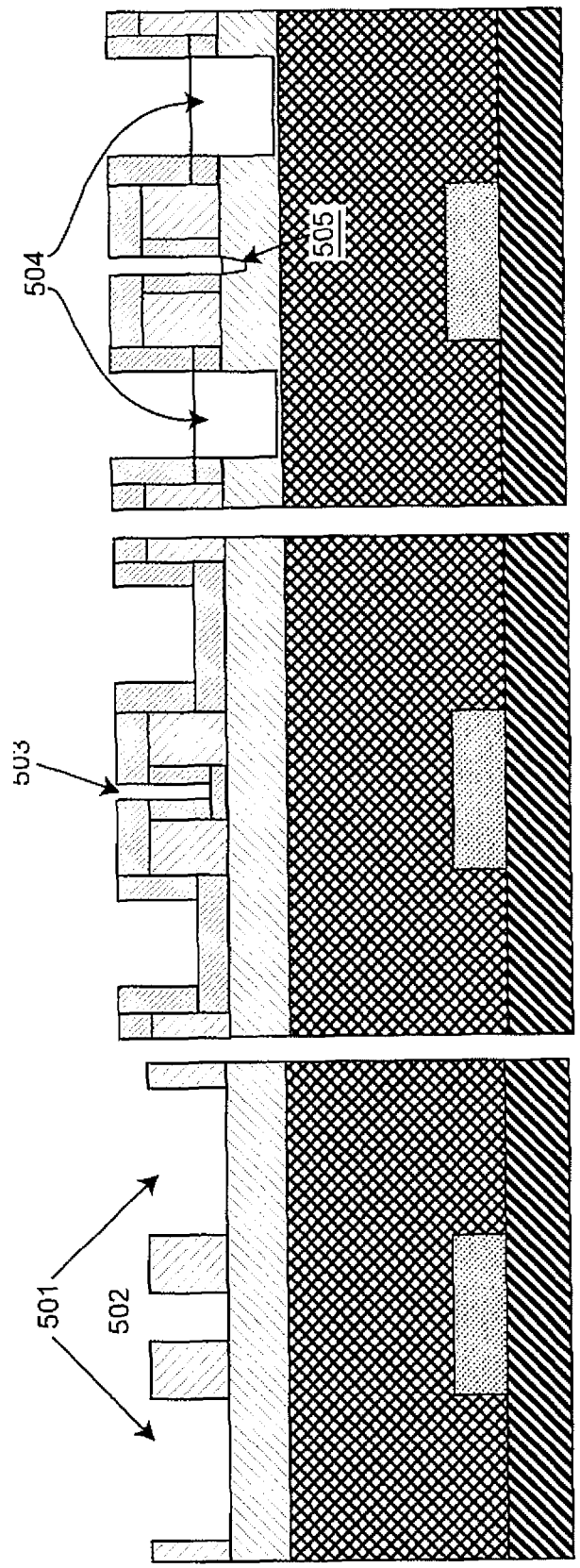

PATTERN IMPROVEMENT IN MULTIPROCESS PATTERNING

FIELD OF THE INVENTION

The present invention generally relates to the manufacture of semiconductor devices and, more particularly, to the formation of very fine features in close proximity to each other with minimum variation from the design pattern.

BACKGROUND OF THE INVENTION

Historically, integrated circuit designs have been driven to smaller feature sizes and increased integration density by the incentives of improved performance, increased functionality of a single chip and reduced cost of manufacture. For example, smaller device sizes and increased proximity reduces signal propagation time, allowing higher clock speeds and reduced susceptibility to noise while providing for more devices that can be formed with a given sequence of processes on a single chip and which are thus available to perform more complex and or more numerous functions concurrently.

Throughout the development of integrated circuit devices, device size and density on an integrated circuit chip has been limited by the ability of lithographic processes to produce patterns in a resist or hard mask with sufficient accuracy of shape/critical dimensions and sufficient reliability to support acceptable manufacturing yield. However, state of the art semiconductor designs and processes are approaching the theoretical limits of optical lithography to the point where a single optical exposure can no longer be used to pattern a given single wafer level; largely due to diffraction effects at apertures in optical masks and radiation scattering effects in a resist. Optical diffraction and scattering effects cause partial exposure of a resist in the vicinity of the intended area of exposure as well as distortion of the intended exposure pattern or shape and, since resist exposure is cumulative, exposure of features in close proximity to each other can increase distortion, alter size and may even cause additional patterns to be exposed. Variation of resulting feature shape from desired feature shape may also be caused by characteristics of a process such as etching for forming the desired structures.

To address the problems related to exposure which are collectively referred to as optical proximity effects, a process (that is not admitted to be prior art in regard to the present invention) involving a sequence of resist exposure and development processes has been used to build up the desired pattern of features in a hard mask by using a sequence of patterned exposures where features are much less proximate to each other than in the final design. Such a process can use as many lithographic exposures as necessary to reduce optical proximity effects to an acceptable level or to avoid them altogether and will be referred to hereinafter as multiprocess patterning. However, such processes may also be referred to as double expose, double etch processes or the like even when the number of exposure and etch sequences is not limited to two. The completed hard mask is then used to transfer the desired pattern into underlying semiconductor material by etching or the like. However, such processes do not correct or even consider feature distortions due to material removal processes and are very limited in capacity for assuring fidelity of the semiconductor device features to the original integrated circuit design.

SUMMARY OF THE INVENTION

It is therefore an object of the present invention to provide a methodology and apparatus for improving fidelity of final manufactured integrated circuit features and critical dimensions to original integrated circuit designs consistent with a multiprocess patterning process to minimize not only optical proximity effects but to optimize fidelity to the original design of the entire pattern transfer process, particularly in regard to multiprocess patterning procedures.

It is a further object of the invention to provide a technique for making material deposition and removal processes more uniform and less sensitive to feature size, density and spatial relationships, taking into account distance between features of varying sizes, local topology, geometric relationships and the like.

In order to accomplish these and other objects of the invention, a method of semiconductor manufacture and an integrated circuit manufactured thereby are provided wherein the method comprises modeling processes to be used in said patterning of a hard mask and transferring a pattern of the hard mask to an underlying material to create process and lithographic exposure models, creating a model based hard mask pattern based on a design pattern and a process model for etching the underlying material, creating a model based resist pattern based on the hard mask pattern and a process model for etching the hard mask, transferring the resist patterns to the hard mask to form a hard mask pattern, and transferring the hard mask pattern to an underlying material.

In accordance with another aspect of the invention, a semiconductor manufacturing method is provided including steps of forming a process assist feature proximate to a pattern feature, and reducing a rate of material deposition or removal during formation of a pattern feature proximate to the process assist feature.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A, 2B and 2C are a sequence of cross-sectional views of intermediate stages of manufacture of a semiconductor chip during adjustment of critical dimensions, sometimes referred to as a shrink process, FIG. 3B is a flow chart illustrating pattern decomposition and pre-correction in accordance with the invention, FIGS. 3C, 3D, 3E and 3F are views of intermediate stages of semiconductor chip manufacture to facilitate an understanding of the processes depicted in FIGS. 3A and 3B, FIGS. 4A, 4B and 4C are a sequence of cross-sectional views illustrating formation of a non-printing assist feature for a shrink process that may be employed in some embodiments of the invention, FIGS. 5A, 5B and 5C are a sequence of cross-sectional views illustrating formation of a non-printing assist feature for a combination shrink and etch process that may be employed in some embodiments of the invention.

DETAILED DESCRIPTION OF A PREFERRED EMBODIMENT OF THE INVENTION

Figure 1A:
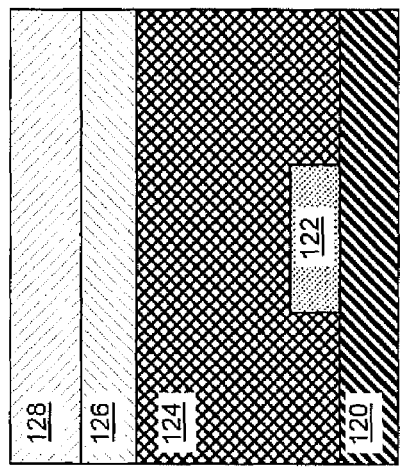
FIGS. 1A, 1B, 1C, 1D, 1E and 1F and 1G, 1H, 1I, 1J, 1K and 1L are sequences of cross-sectional views of intermediate stages of manufacture of a semiconductor chip by multiprocess patterning, FIGS. 1A-1F being generalized and FIGS. 1G-1L showing application to formation of transistor contacts.

Referring now to the drawings, and more particularly to FIGS. 1A through 1L, there is shown a sequence of cross-sectional views of an exemplary intermediate multiprocess patterning stage during manufacture of a semiconductor device. FIGS. 1A-1F and 1G-1L illustrate substantially the same process but FIGS. 1A-1F are more generalized and schematic while FIGS. 1G-1L illustrate a more detailed practical exemplary application of the multiprocess patterning to form, for example, closely spaced contacts to a transistor. Similar reference numerals will be used in both Figures. Further, at the level of detail illustrated in these Figures, the invention may or may not be employed therein. Therefore no portion of either FIGS. 1A-1L or FIGS. 2A-2C is admitted to be prior art in regard to the present invention.

FIG. 1A illustrates a generalized semiconductor structure at an intermediate stage of manufacture comprising a substrate or previously semiconductor layer 120 with a generalized structure such as a connection or transistor gate 122 formed thereon and covered with a dielectric layer 124. Additional structures can be formed in substrate or semiconductor layer 120 which are not shown in the interest of clarity. Such structure are desirably overlaid with an etch stop material 121 as shown in FIG. 1G. If structure 122 is a transistor gate, sidewalls 123 would normally be formed thereon and a silicide cap 125 may be included as well (e.g. to function as a marker or etch stop).

Hard mask material layer 126 is formed thereover and a resist 128 applied. It is desirable to form the hard mask material layer as a multi-layer structure including an optical (or organic) planarization layer (OPL) 127a and anti-reflection coating (ARC) and hard mask layer that may include additional layer(s) to protect the hard mask and/or resist from contamination from layers or material beneath them, collectively illustrated at 127b. Other layers may be included as may be deemed desirable.

Figure 1B:
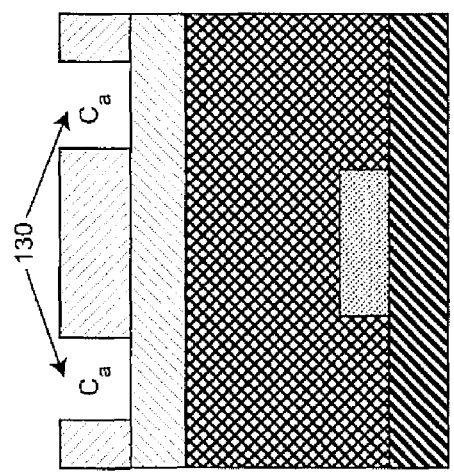
Figure 1C:
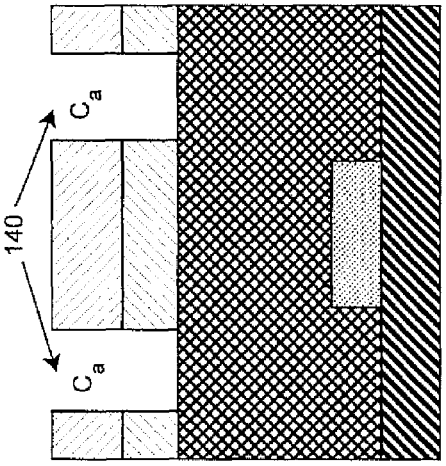
Figure 1D:
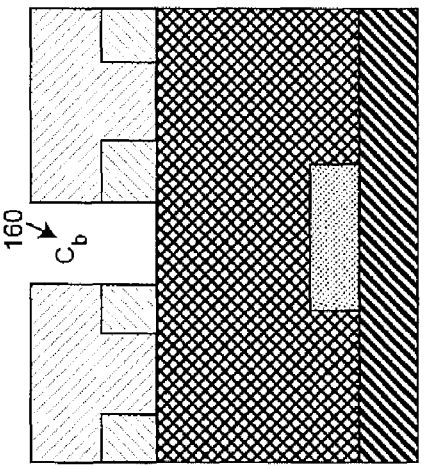
Figure 1E:
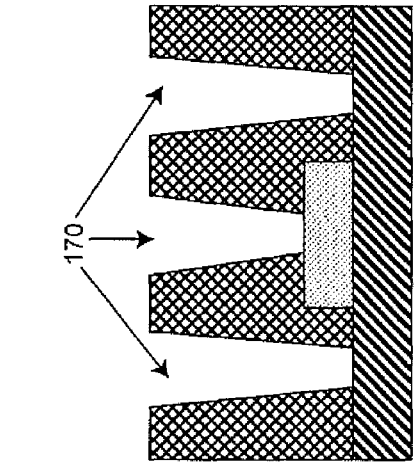
Figure 1F:
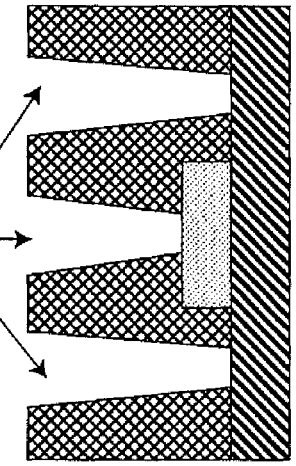
Figure 1G:
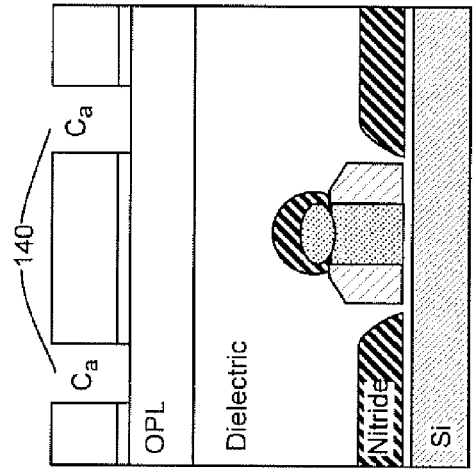
Figure 1H:
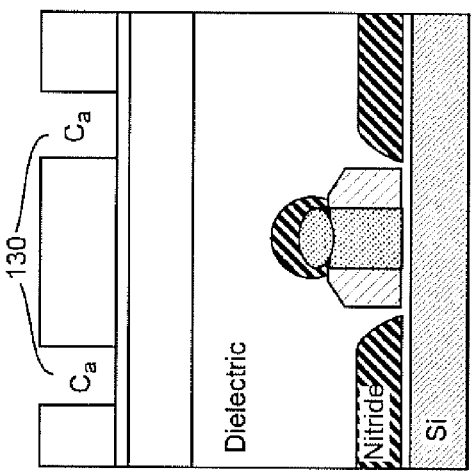
Figure 1I:
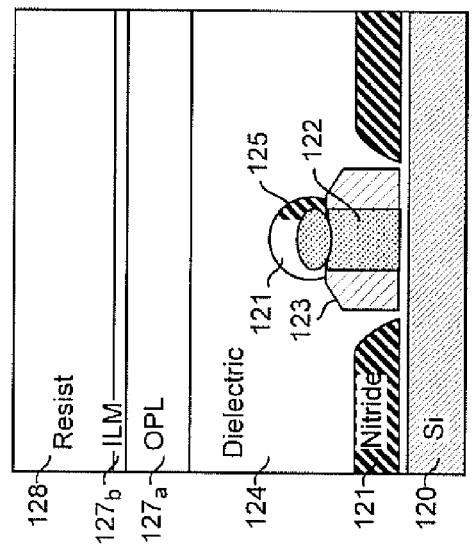
Figure 1J:
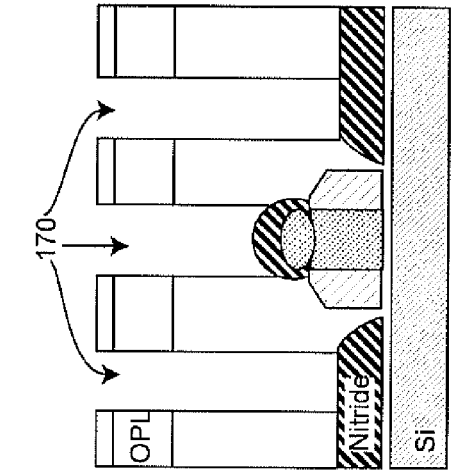
Figure 1K:
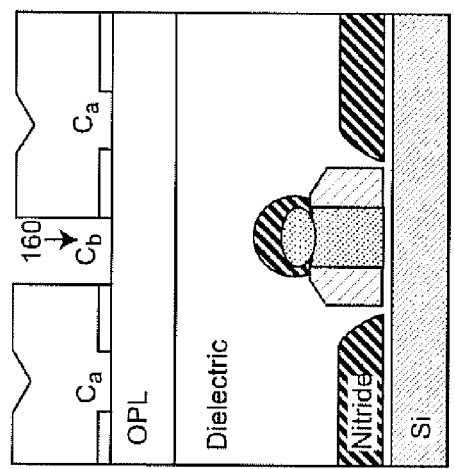
Figure 1L:
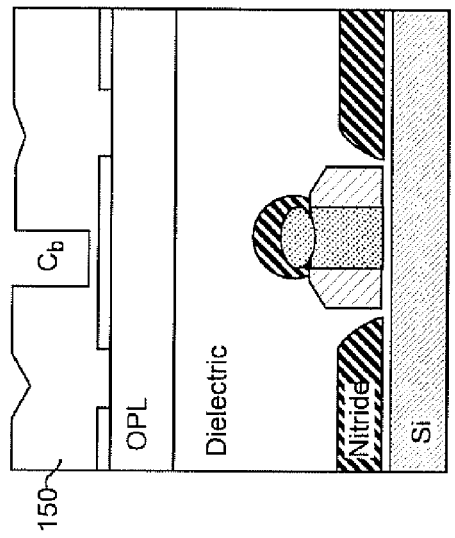

The resist is then exposed and developed to form resist features Ca 130 in the resist as shown in FIGS. 1B and 1H and the pattern 140 transferred to the hard mask material layer 126 by an etching process as shown in FIGS. 1C and 1I. Then, as shown in FIGS. 1D and 1J, the remainder of resist 128 is stripped and another resist layer 150 is applied, exposed and developed to form another pattern Cb and the hard mask is again etched to transfer the pattern to the hard mask as shown at 160 in FIGS. 1E and 1K. The remainder of resist layer 150 can then be removed. The portion of the process depicted in FIGS. 1D and 1E or 1J and 1K can be repeated as many times as may be desired or necessary to build a hard mask of the intended design. Different resists, types of exposure, resist developers and hard mask etchants can be used for each resist-pattern-etch sequence and such flexibility constitutes a major advantage of multiprocess patterning since features may be sorted among the lithographic masks or exposure layers and materials, processes and lithographic exposure parameters chosen to be optimal for each layer.

The structure is then again etched in accordance with the pattern formed by the hard mask to form apertures or recesses 170. A further etch may be required if etch stop material 121 is used, as will generally be the case. Apertures or recesses 170 may then be filled with desired materials such as metal for forming contacts and the structure further processed to complete the device.

As noted above, the basic multiprocess patterning sequence can be varied to advantage in many ways using, for example, different film compositions and additional films. One variation which has particular utility in several new and variant foams in connection with the present invention is illustrated in FIGS. 2A-2C and referred to as a shrink process which will be discussed in connection with performance at the resist level but it should be understood, as will be appreciated by those skilled in the art, that substantially the same process could be performed at the hard mask level with the same or different materials. FIGS. 2A-2C illustrate a sequence of three cross-sectional views of a device. FIG. 2A is essentially the same as FIG. 1C (or 1I) (or 1E) except that the features 202 formed in the hard mask or resist are of a size which is larger than the hard mask feature desired and approximately the same as the distance 203 between them which may provide advantages in the resist exposure process. Dimension 202 in the patterned resist may be reduced in a manner similar to forming sidewalls on a transistor gate or other raised structure by conformal deposition of a material film layer 204 which may be the same as the material of the resist (or hard mask if the process is performed at that level) or a film of different material and then performing a directional (e.g. anisotropic) etch to reduce the dimension 202 by approximately twice the film thickness as shown at 205 of FIG. 2B. The feature of reduced size 205 can then be transferred into the hard mask or underlying material by further or different etching as shown at 206 in FIG. 2C.

It should be appreciated that this shrink process can provide dimensions 205 which may be smaller than dimensions which can be imaged lithographically (e.g. sub-lithographic feature sizes) and, while the same reduction in feature size will be performed for all features formed in a given resist-pattern-shrink-etch process sequence, a different shrink process and feature size adjustment could be performed on each resist (e.g. 128, 150, etc.). It should also be appreciated that a similar shrink process can be performed directly on the hard mask by conformally depositing and directionally etching hard mask material or a different material film; potentially using block-out masking to allow different amounts of feature size reduction on different features. It should be appreciated that such shrink processing can be practiced with many variations and other shrink processes can be envisioned by those skilled in the art, particularly in view of the numerous known techniques for forming sidewalls on other structures. Variations of this general shrink process as described above which are of particular utility in connection with the present invention will be described below.

It should also be understood that other size adjustment processes can be employed and even used to provide adjustment of overlay positioning by, for example, making an angled deposition of the conformal layer 204 so that deposition thickness differs on opposite sides of an aperture 202. Feature expansion techniques such as by overdeveloping the resist (e.g. to develop regions partially exposed by radiation scattering within the resist film) or etching to undercut the resist or the like, as will be apparent to those skilled in the art, may alternatively be employed. Different amounts of feature shrinkage or expansion may be selectively performed for different hard mask features in accordance with each multiprocess patterning layer or by blackout masking on the hard mask by providing different thicknesses of conformal deposited layer 204, different materials and different directional etch processes.

As alluded to above, the shapes lithographically exposed on the resist will be imperfectly formed when the resist is developed and additional shape variation will occur in the etching of the hard mask and even more variation will occur when etching underlying material. In general, for several practical reasons, features are defined at the design stage to have a generally rectangular outline with various aspect ratios (or elongated angular features such as for connections) while it is well-understood and expected that the features actually produced will be somewhat rounded at angles in the perimeter of features (e.g. low aspect ratio features such as contacts will be designed as rectangular or square features but will be formed as an elliptical or circular shape while high aspect ratio, elongated shapes will generally be formed with slightly differing width and be rounded at corners and other angles in the feature pattern). It is also generally the case that features produced directly from a lithographic exposure will have very good fidelity to the patterns shape that is exposed (e.g. differences from the exposed shape will be very small), partially due to the fact that lithographic exposures are made with a significant degree of demagnification such that the lithographic exposure mask features can be substantially larger than in the resist pattern actually exposed. Demagnification also allows assist features to be formed in the lithographic exposure mask that cannot be resolved on the resist but serve to alter the exposure dose in desired areas of the resist. Good fidelity to the original pattern can also be achieved where the depth to width aspect ratio is low, as is the case when patterning a thin hard mask film and/or using a thin resist. The behaviors of resists and materials being etched is generally well-understood and resist exposure shapes may also be adjusted (e.g. pre-corrected) or, at very small feature sizes, assist features employed as alluded to above to obtain good fidelity to the original design.

However, in multiprocess patterning at very small feature sizes and high but usually highly variable feature density, the features formed by a hard mask will usually exhibit significantly greater divergence from the feature shapes and critical dimensions in the hard mask. It should be noted in FIG. 1F that the openings 170 are depicted as tapering, as is typical for very small and high depth to width aspect ratio openings. This variation from ideal etching behavior is principally due to two factors collectively referred to as etch bias which affect the rate at which etching occurs.

The first of these etch bias factors or effects is referred to as microloading which tends to reduce the etch rate where there are many features or substantial aggregate area to be etched, particularly as between different regions of a chip. Microloading is essentially a relative depletion of reactants due to locally increased area to be etched as compared with a region of a chip where less etching is occurring.

The second factor is referred to (sometimes incorrectly, depending on the etch process being employed) as RIE lag (possibly because reactive ion etching (RIE) is generally preferred for performing etching of high depth to width aspect ratio features where the effect is pronounced). Essentially RIE lag is a function of a mask feature size and the depth within a feature where etching is occurring. The etch rate changes during the etch process due to the decrease in circulation of unreacted etchant as depth within a feature increases. RIE lag can also cause differences in distortion between features of differing size. That is, a minimized etching process which is sufficient to complete etching of the smallest feature to be produced will cause overetching of all larger features in feature size dependent varying degrees. Further, as recognized by those skilled in the art, an effect known as inverse RIE lag has been observed which is commonly associated with a particular reactive ion etch chemistry but can sometimes be observed in connection with wide, shallow and relatively isolated features. As used herein, the term RIE lag should be understood as comprehending inverse RIE lag since it is manifested in a change in etch rate depending on a combination of feature geometry and spatial frequency as well as process parameters, chemistries, materials and the like.

Multiprocess patterning inherently requires that a design pattern be decomposed into two or more patterns with more widely separated features so that optical proximity effects can be reduced or eliminated and several automated methodologies and computer implemented algorithms are known at the present time (but are not admitted to be prior art in regard to the present invention). Similarly, optical proximity correction (OPC) algorithms are known that allow correction for the non-linearities associated with the optical lithography processes used to print patterns and which can be applied to the patterns resulting from pattern decomposition for multiprocess patterning to reduce any remaining optical proximity effects. However, these OPC algorithms have only dealt with optical and photoresist effects and have not addressed the intermediate etch and deposition processes associated with complex multiprocess patterning processes where substantial loss of fidelity occurs through etching of deep features using a hard mask where microloading and RIE lag effects are likely to be significant and complex.

In accordance with the invention, the layout decomposition and model-based proximity correction, collectively referred to as mask data preparation (MDP), is optimized based on modeling both lithographic and non-lithographic (e.g. etching and deposition, including microloading and RIE lag effects) processes. The optimization to account for both types of effects is referred to as model-based retargeting (MBR). Basically, the invention obtains high fidelity to the original design for an integrated circuit through building models based on empirical data for the lithographic exposure, resist development, etching and shrink/expand processes for various feature sizes, etch or deposition depths, materials (possibly including such detailed information as crystal lattice orientation and dopant concentrations) and process reactants. Then, using the design pattern, working backwards from the intended design, using the models to determine critical dimensions in the hard mask, decomposing the resulting hard mask pattern into a plurality of sets of targets; generally based on different critical dimension sizes for reducing the number of effects that must be considered and determining any needed shrink/expand processes in each of the respective sets of targets. Then, the invention provides for model based retargeting of patterned shapes in resist that must be formed to obtain the needed hard mask feature shapes in each of the patterns created by decomposition (sometimes referred to hereinafter as layers which may also connote the entire expose-develop-etch-shrink/expand process for a set of targets into which the hard mask pattern is decomposed) and then performing optical proximity correction to obtain the final shapes of features of the lithographic exposure mask for each decomposed pattern. It should be noted in this regard that decomposing the hard mask pattern based on feature size to limit the number of effects that are produced using each layer allows a relatively simple model to be built for each process and for each model to be individually applied while individual processes may be similarly optimized. Thus, for each layer into which the hard mask pattern is decomposed, there will be an optical process model, a photoresist model, a hard mask etch model and a shrink/expand model and one additional etch model corresponding to the etch of openings 170 of FIG. 1A-1F. For example, a process having two resist exposures will involve nine process models, a process having three resist exposures will involve thirteen models and so on. In general, the models, at least as applied, will not be duplicative since decomposition is preferably based, at least in part, on segregation of patterns/features by critical dimension and/or shape (e.g. feature aspect ratio). Thus, even where processes involve the same materials and reactants but differ in feature size and/or spatial frequency (or vice-versa) the process models will necessarily differ.

It should also be appreciated in this regard that the number of models that may be employed in the practice of the invention is dictated as much by process parameters, materials and reactants as by the decomposition employed in multiprocess patterning. Decomposition is used when lithographic and/or etch processes cannot support a given feature size and spacing. Decomposition thus places the spacing, feature density and feature size of portions of a desired pattern for any given layer into aa regime where known processes can transfer patterns to a material. However, the number of models which may be employed in the practice of the invention is directly proportional to the number of unique processes that are used to transfer a pattern to a material for any given design.

Figure 3A:
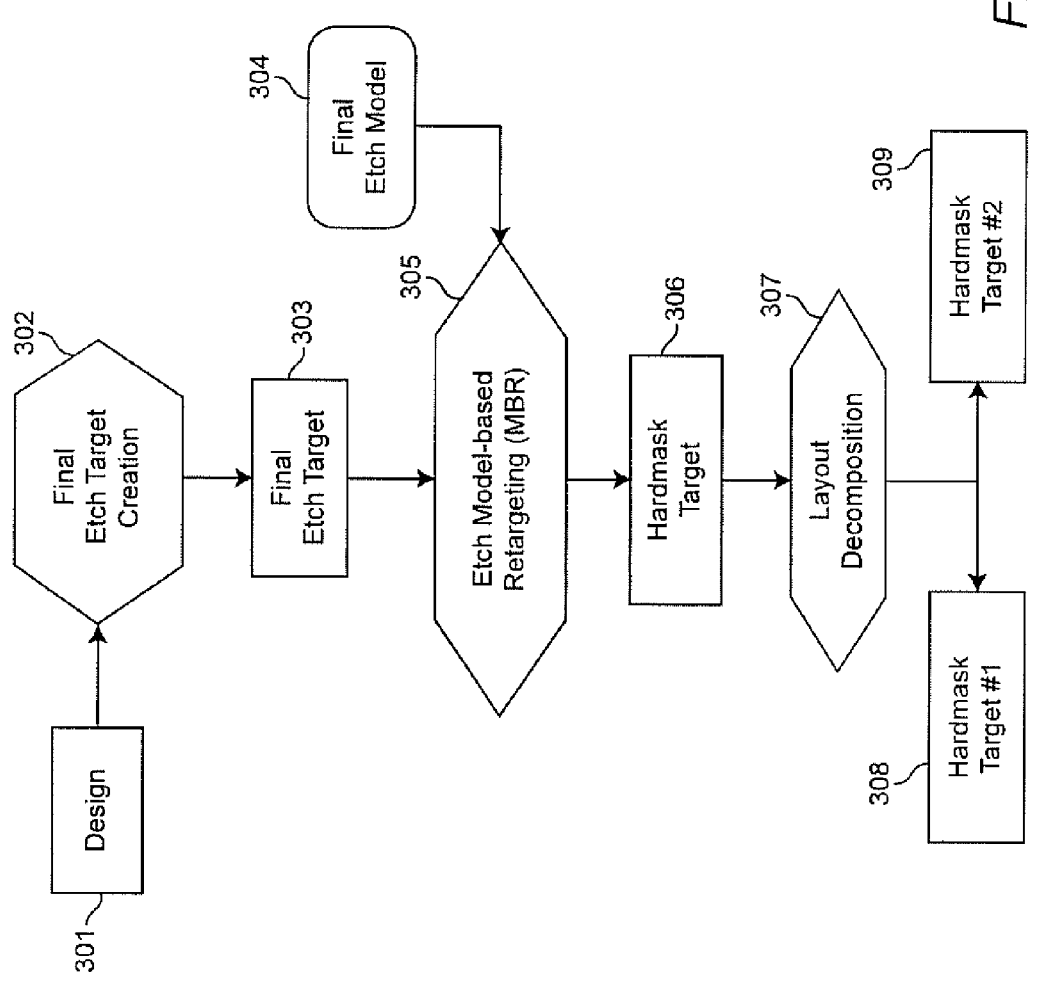
FIG. 3A is a flow chart illustrating basic operations for mask preparation for multiprocess patterning in accordance with the invention.

As illustrated in FIG. 3A, the process in accordance with the invention starts with the intended final design 301 from which the target shapes are created in step 302 by using the shapes of the final design or slightly shrunk or expanded versions thereof to determine the final etch target pattern 303. The final etch target pattern is then used in a model based retargeting (MBR) process using the final etch model 304 (e.g. a model of the process to be used to form openings 170) to solve an inverse problem of determining the shapes needed in the optimum hard mask pattern 306. Essentially, this process maps critical dimensions $C_1$, $C_2$ and $C_3$ based on the intended design to critical dimensions $h_1$, $h_2$ and $h_3$ as illustrated in FIG. 3D; illustrating the development of the hard mask target pattern from the intended design.

The resulting hard mask layout pattern is then decomposed in step 307 to develop hard mask pattern layers 308, 309, etc. having features that produce compatible effects that can be modeled in relatively simple models or are at least relatively consistent across the chip. These models 310, 313, 316, 319, 322, and 325, depicted in FIG. 3B are preferably based on empirical data representing particular process parameters and are determined at run time or prior to the processing of FIG. 3A described above. It should be understood that lithography models 316 and 325 are composite models of the optical model and the resist model as described above and are so depicted only for convenience of illustration. It should also be understood that shrink model 310 may or may not differ from shrink model 319 depending on critical dimension size and lithographic exposure constraint. Shrink/expand models are optional in any case but their inclusion will usually be justified by the optimization of lithographic exposure parameters they engender as well as extending critical dimensions to sizes below those which can be resolved in a lithographic exposure. Likewise, intermediate etch models 313 and 322 and lithography models 316 and 325 may or may not differ from their counterpart models depending on preferred processes and critical dimensions. Thus, as depicted in FIG. 3B, for each layer or decomposed hard mask target pattern 308, 309, a model based retargeting (MBR) 311, 320 is performed using a particular shrink/expand model 310, 310 to produce hard mask targets 312, 320, a second MBR 314, 323 is performed using intermediate etch models 313, 322 to further refine resist targets 315, 324 and MBR/model based optical proximity correction (MBOPC) 317, 326 are sequentially performed to result in lithographic mask pattern designs for respective layers of the multiprocess patterning in accordance with the invention.

It should be appreciated in this regard that regardless of the nomenclature used to identify a particular process or process model, all process models should be accurate representations of pattern transfer processes which may be used to determine if particular processes such as shrink/expand processes are required to transfer a pattern accurately or modifications of other pattern transfer processes and the patterns/shapes to be employed (e.g. inclusion of assist features, inclusion of a feature in one layer rather than another and the like) to ultimately form a feature with highest possible fidelity to an original design. That is, the models, themselves, do not cause a shrink or expansion but, rather, represent the processing space available to effect a shrink or expand process if inclusion of such a process would yield improved fidelity to the original design.

Figure 3D:
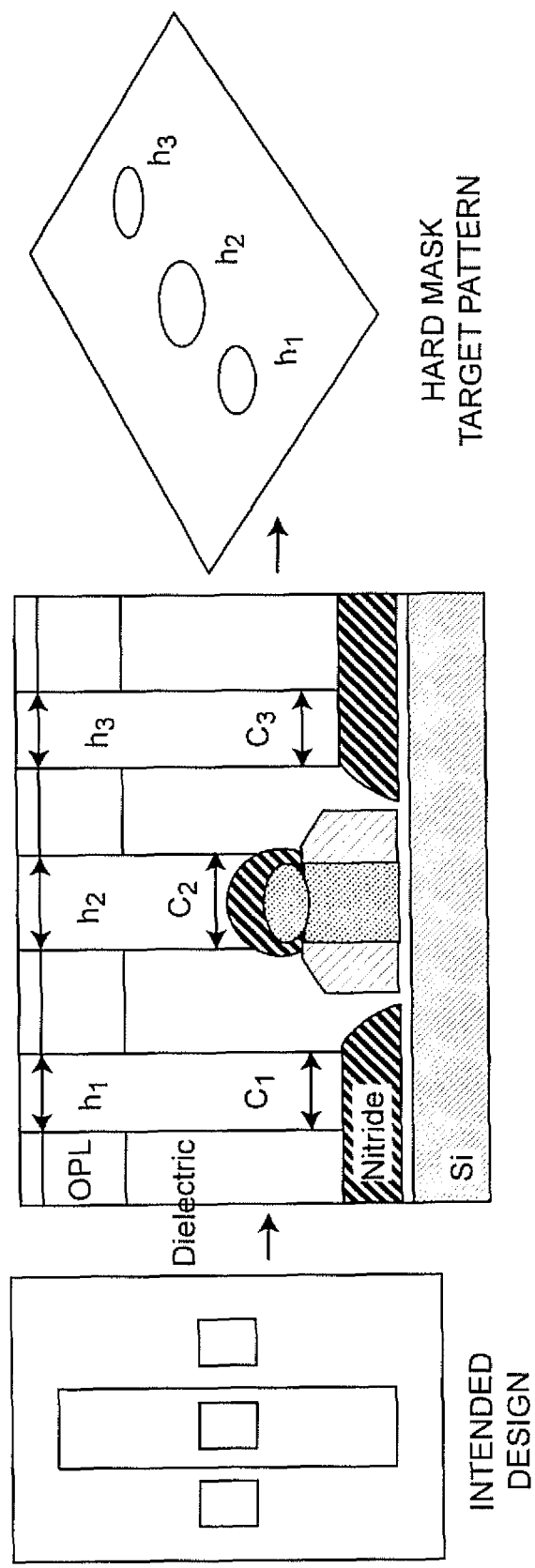
Figure 3E:
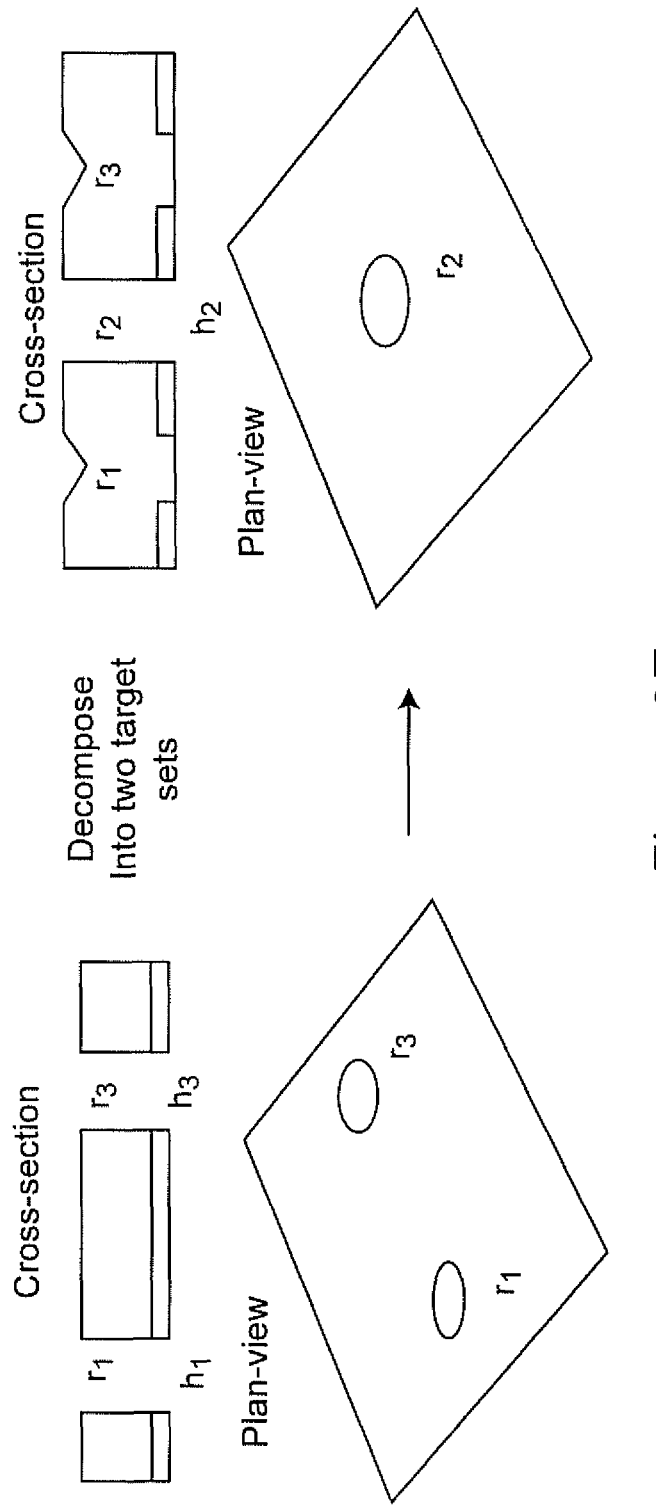
Figure 3F:
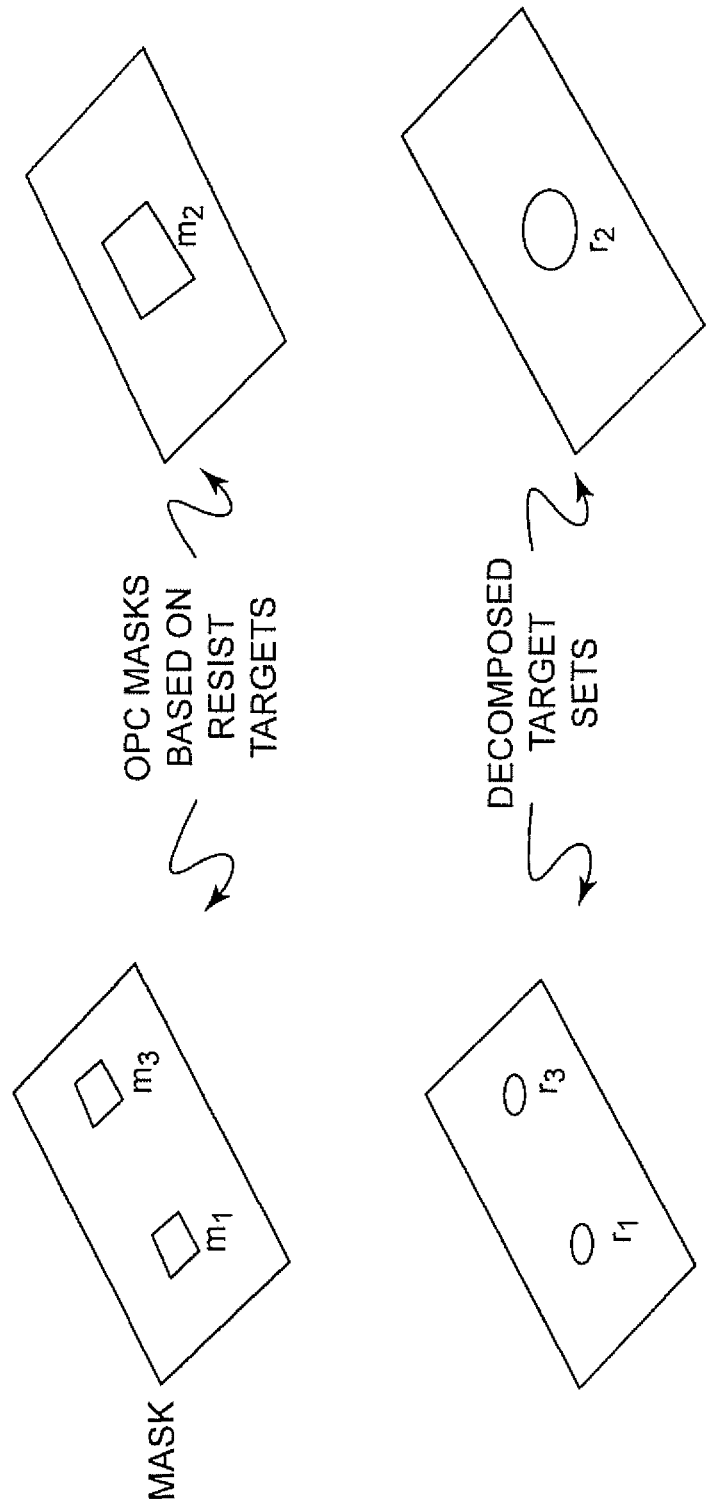

The processes depicted in FIG. 3B may be visualized as decomposing the hard mask target pattern of FIG. 3D into two or more patterns and then respectively mapping dimensions $h_1$, $h_3$ and $h_2$, through separate processes to dimensions $r_1$, $r_3$ and $r_2$, respectively, as illustrated in FIG. 3E and then mapping dimensions $r_1$, $r_3$ and $r_2$, through separate model based optical proximity correction (MBOPC) process sequences to final mask pattern features $m_1$, $m_3$ and $m_2$, respectively, as illustrated in FIG. 3F to produce fully process-aware and optimized patterns for the respective layers of the processes depicted in FIGS. 1A-1F and 1G-1L which are also the optimum lithographic exposure mask patterns for producing features most closely approximating the original design of an integrated circuit.

Having described the basic invention and its underlying principles sufficient to its practice to obtain the advantages thereof, several perfecting features of the invention will now be discussed with reference to FIGS. 4A-7. Specifically, optical assist features have been alluded to above as being additional features of a lithographic exposure mask which can exploit some diffraction effects to improve the fidelity of shapes and critical dimensions of desired features to features of an integrated circuit design. However, it is generally important to avoid or prevent such assist features from exposing regions of the resist which do not fall within the intended features and numerous arrangements such as phase shift regions and gray scale mask features have been developed in an effort to achieve the beneficial function of feature fidelity improvement without significant production of additional areas of the resist which are sufficiently exposed for additional pattern feature corresponding to the optical assist features to be developed.

The inventors have discovered that a process counterpart of optical assist features can be even more flexibly used and may provide, in many cases, even greater improved fidelity to the original design than optical assist features. It remains necessary to prevent process assist features from fully printing to the hard mask to form extraneous features therein. However, from the discussion below, it will be seen that, in general, there is far greater process latitude in doing so which can be exploited to advantage.

It will be helpful to an understanding of these perfecting features of the invention to recall the discussion of microloading and RIE lag, above, both of which reduce etch rates under different conditions and circumstances relative to the feature pattern to be produced and the feature distortions that can be produced thereby. In addition to that discussion, it should be noted that microloading can also affect local material deposition rates by causing relative concentration or dilution of reactants in the affected local areas where deposition is to occur.

Referring now to FIGS. 4A-4C, a sequence of cross-sectional views of an exemplary portion of a semiconductor integrated circuit chip is shown generally corresponding to a state of FIG. 1B (or a later repetition), where a pattern from preceding layers has not been transferred to the hard mask or between FIGS. 1E and 1F where the resist has been stripped to leave the hard mask pattern but the hard mask pattern has not yet been transferred to the underlying material. In this case, as shown in FIG. 4A, hard mask apertures 401 are intended hard mask features and the smaller feature 402 is a process assist feature (as distinct from an optical exposure assist feature although the same feature can perforin both functions). Recalling the shrink process discussed above is connection with FIG. 2, the larger intended hard mask features 401 are to be reduced in size. However, deposition rate of layer 403 will depend on the relative density of such features across the chip. That is, if the features 401 are relatively more sparse, deposition of material 403 will proceed more rapidly and produce a greater film thickness compared with regions where similarly sized features are more dense or features of other sizes expose relatively more deposition area. The more rapid deposition will caused the features 401 to be shrunk more in regions where they are relatively sparse than in other areas.

However, since the deposition of material 403 is conformal, a small process assist feature 402 (e.g. sufficiently small to be filled by the intended thickness of deposited material 403, as shown in FIG. 4B) is provided and the area on which deposition will occur is far greater than the area of the process assist feature 402, itself, since the sides of the process assist feature also provide area on which deposition will occur. Therefore, it can be seen that a relatively few small process assist features can have the effect of increasing deposition area and simulating much greater density of features 401 than actually is presented by the desired pattern features. Thus process assist features can be used to substantially equalize effective density of desired features or deposition areas across the chip to minimize distortion due to deposition microloading. Thus the final critical dimension of apertures 404, whether in the hard mask or underlying material, can be made substantially consistent for the entire chip and the process models correspondingly simplified. Conversely, use of small process assist features can provide different amounts of feature shrinkage in different areas of the chip.

Referring now to FIGS. 5A-5C, a variation on the process assist feature of FIGS. 4A-4C will be discussed. This variation allows microloading during material removal to be equalized across the chip or locally adjusted, as well as providing such advantages for material deposition. In this case, intended features 501 are present as before but process assist feature 502 is slightly larger relative to the thickness of conformally deposited material (corresponding to 403 of FIG. 4B such that a very small opening or gap 503 remains. Process assist feature 502 affects microloading during deposition precisely as described above in connection with FIGS. 4A-4C. However, opening 503 provides increased area during etching and can thus increase microloading during material removal processes. At the same time, however, since the gap 503 is of very high depth to width aspect ratio (e.g. potentially the width of opening 503 may be less than one hundred times the diameter of a molecule or ion of etchant), RIE lag is particularly pronounced and the etch rate for both the directional etch of conformally deposited material and/or etch of the hard mask or other underlying material to form apertures or trenches 504 so that, at most, only a small dimple 505 is formed while openings 504 are completely etched. Even this dimple 505 can be avoided if the conformally deposited material is selectively etchable to the underlying material since the conformally deposited material can be removed in openings 501 while directional etching in process assist feature 503 remains incomplete due to more pronounced RIE lag. It should also be noted that RIE lag in features 503 will cause substantial variation in microloading effects in accordance with the width of the process assist features and the microloading due to a given process assist feature 503 may be quite small and require a relatively large number of such features to achieve the desired effect. In other words, the desired microloading effects during material removal processes affects the number and dimensions of process assist features 503 but the only constraint on the design thereof is to engender RIE lag which is significant relative to the etch rate reduction due to microloading.

As will be appreciated, there are many possible configurations of process assist features. For example, a small hole placed near an isolated line pattern will cause that isolated line pattern to etch more nearly in the manner of a nested line pattern (e.g. among other line patterns) while a following shrink pattern (e.g. performed in a process for a subsequent layer) may fill the holes completely and prevent the hole pattern from being transferred into the hard mask or other underlying material or in the final etch process. It should also be noted that because the etch and shrink assist features do not interact coherently with the main or intended features as is the case with traditional optical sub-resolution assist features, their placement and sizes can be very different. However, with proper modeling of all processes, the optical assist features and the process assist features can be co-optimized and combined. That is, in some cases optical assist features may also serve as process assist features and the printing will be optimized in such a way that such features will be removed during subsequent etch and shrink steps.

Figure 6:
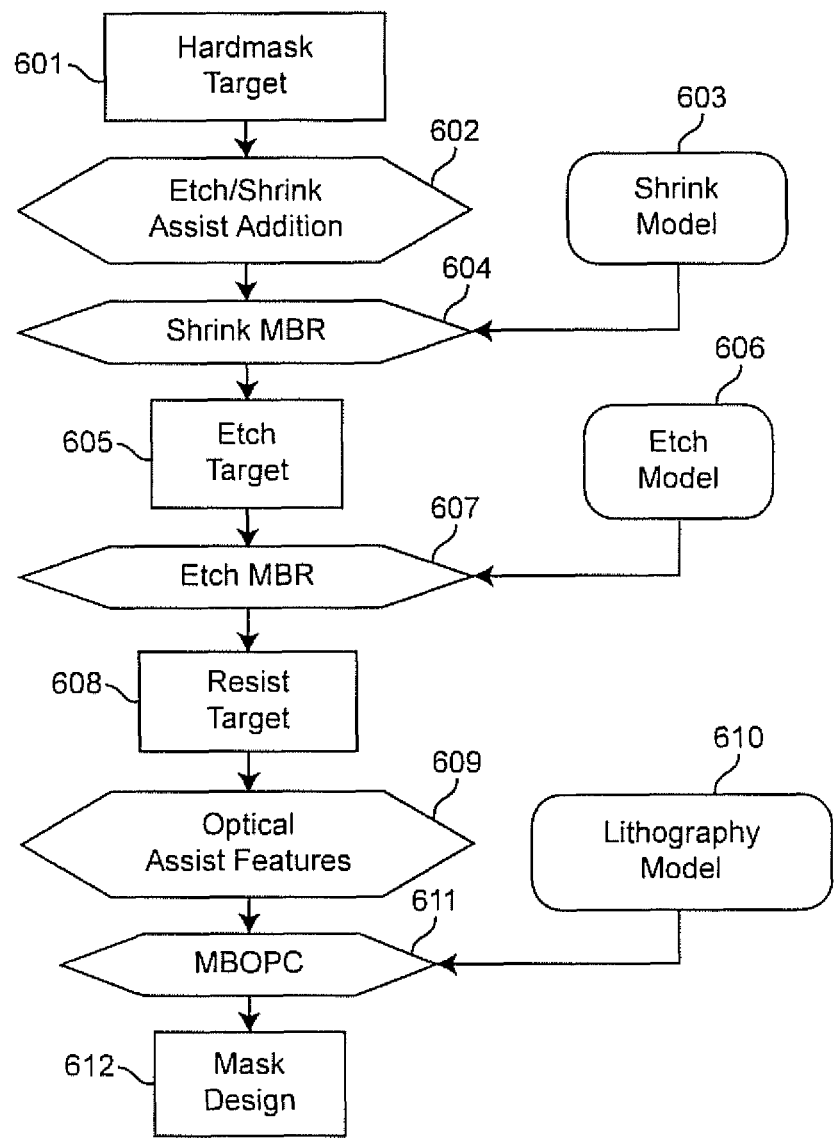
FIG. 6 is a flow diagram for a mask data preparation flow that can be used to add assist features which are co-optimized for shrink and etch processes to create an exemplary pair of mask designs for multiprocess patterning which includes intermediate shrink processes useable in some embodiments of the invention.
Figure 7:
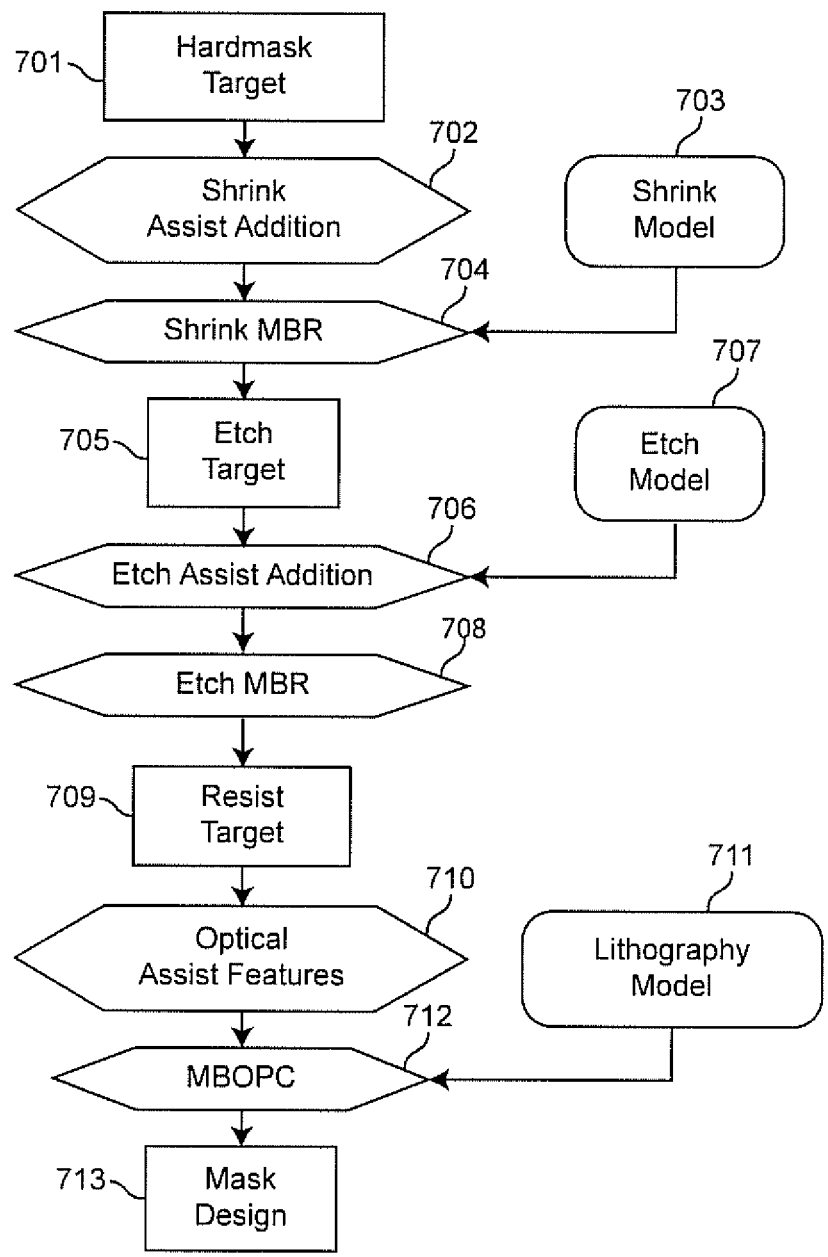
FIG. 7 is a flow diagram for a mask data preparation flow that can be used to add assist features which are individually optimized for shrink, etch and lithographic processes to create an exemplary pair of mask designs for multiprocess patterning which includes intermediate shrink processes useable in some embodiments of the invention.

An exemplary MDP process for placing process assist features is illustrated in FIG. 6. In this case, a hard mask target 601 created from the process illustrated in FIGS. 3A-3C can first be modified to include common shrink and etch features in step 602 and then the shrink model 603 applied through a shrink MBR 604 step to create the etch target 605. Steps 606-612 are similar to FIG. 3. The addition of optical assist feature is optional. FIG. 7 shows a similar process in which the addition of shrink assist features and etch assist features are separately called out in order to decouple the material deposition microloading effects from the material removal microloading effects, if desired.

In view of the foregoing, it is clearly seen that the invention provides for exploiting and extending the meritorious effects of multiprocess patterning to achieve much increased fidelity of a manufactured integrated circuit to the original design by modeling each process in accordance with optimal parameters and working backward from the original design to optimize the hard mask pattern, the resist pattern and the lithographic exposure pattern, in turn. The particular optimization performed can accommodate any desired materials feature parameters and processes deemed optimal for any particular layer of the multiprocess patterning and extends the effects of sorting the features to allow processes to be optimally chosen for the types of features in a decomposed layer and the exposure pattern to be optimized for the chosen process while applying model based optical proximity correction to any optical proximity effects remaining in the multiprocess patterning design. Perfecting features of the invention include process assist features to enable localized control of microloading for either or both material deposition and/or material removal processes in a manner consistent with the optional use of optical exposure assist features. In summary, by creating process and exposure models based on empirical data and applying model based retargeting to the original design in an order opposite to the exposure and process order for multiprocess patterning, optimum shapes and critical dimensions of features can be determined in the hard mask and the lithographic exposure masks for respective layers of the multiprocess patterning to achieve maximum fidelity to the original design in the pattern produced in the integrated circuit device being manufactured. By the same token semiconductor integrated circuits made in accordance with the process described above can be fabricated at higher manufacturing yield and at higher integration density than previously possible due to the increased fidelity to the original integrated circuit design of patterns developed in and for particular structures that is maintained throughout the lithographic, hard mask and semiconductor material patterning processes for manufacture of the integrated circuits and which may be applied to any design due to the flexibility of combinations of patterning processes engendered through the process-aware methodologies in accordance with the invention. Conversely, the invention avoids a need to reduce integration density to support acceptable manufacturing yields.

While the invention has been described in terms of a single preferred embodiment, those skilled in the art will recognize that the invention can be practiced with modification within the spirit and scope of the appended claims.

What is claimed is:

1. A method of forming a mask layer during manufacture of a semiconductor integrated circuit, comprising steps of:
    forming one or more pattern features in a mask material which are initially oversized apertures;
    forming one or more process assist features in said mask material which are holes proximate to said one or more pattern features; and
    performing a conformal shrink process whereby a shrink material is deposited on surfaces of said one or more pattern features and said one or more process assist features,
    wherein said one or more process assist features are sized such that said step of performing substantially fills and hence eliminates said holes, and
    wherein said step of performing is conducted such that depositional microloading caused by said one or more process assist features reduces an amount of shrink material deposited on surfaces of said oversized apertures such that said one or more pattern features have a desired critical dimension upon conclusion of said step of performing a conformal shrink process, but in an absence of said one or more process assist features said step of performing a conformal shrink process causes said oversized apertures to become smaller than said desired critical dimension.

2. The method as recited in claim 1, wherein said mask material is a hard mask material.

3. The method as recited in claim 1, wherein said mask material is a resist material.

* * * * *